United States Patent [19]

Moon

[11] 4,404,686
[45] Sep. 13, 1983

[54] FOUR BAND VHF VARACTOR TUNER TO COVER EXTENDED CATV BAND UTILIZING TWO SWITCHING DIODES PER RESONANT CIRCUIT

[75] Inventor: Frederick H. Moon, Mt. Prospect, Ill.

[73] Assignee: Zenith Radio Corporation, Glenview, Ill.

[21] Appl. No.: 211,494

[22] Filed: Dec. 1, 1980

[51] Int. Cl.³ .............................................. H04B 1/16
[52] U.S. Cl. .................................... 455/191; 455/180; 334/15
[58] Field of Search ............... 455/180, 188, 190, 191, 455/195, 333; 334/15

[56] References Cited

U.S. PATENT DOCUMENTS

| | | | |
|---|---|---|---|
| 4,002,986 | 1/1977 | Ma ........................................ | 455/188 |
| 4,048,598 | 9/1977 | Knight .................................. | 455/195 |
| 4,160,213 | 7/1979 | Carter .................................. | 455/180 |

Primary Examiner—Jin F. Ng
Attorney, Agent, or Firm—Jack Kail

[57] ABSTRACT

A television receiver tuning system includes a bandswitchable impedance transformation circuit operable for improving the impedance match between a varactor tuned resonant circuit and the gate electrode of a field effect transistor (FET) at the low ends of a plurality of television signal frequency bands. The impedance transformation circuit comprises a capacitor connected in series between the varactor tuned circuit and the gate electrode of the FET and a bandswitchable inductive network connecting a different selected inductance in shunt with the gate electrode of the FET for each tuned frequency band, each value of selected inductance providing, in association with the series connected capacitor, a resonant point below the lowest frequency of the associated frequency band.

4 Claims, 2 Drawing Figures

FIG. 2

| BAND | LOW VHF | HI/MID VHF | SUPERBAND | UHF |
|---|---|---|---|---|
| COND. 41 | 0 | — | — | — |
| COND. 40 | 0 | 0 | — | 0 |
| COND. 66 | — | — | — | 0 |
| D1 | OFF | OFF | ON | OFF |
| D2 | OFF | ON | ON | ON |
| D3 | ON | ON | ON | OFF |
| $L_T$ | $L_1 + L_3$ | $L_1 + (L_2 // L_3)$ | $L_1$ | |

FOUR BAND VHF VARACTOR TUNER TO COVER EXTENDED CATV BAND UTILIZING TWO SWITCHING DIODES PER RESONANT CIRCUIT

BACKGROUND OF THE INVENTION

The present invention relates generally to improvements in television receiver tuner circuits and, in particular, to impedance matching apparatus useful for improving the operation of a multiband, voltage-controlled television receiver tuning system.

A television receiver comprising a single conversion superheterodyne tuning system typically includes a tunable RF amplifier connected for coupling received VHF and CATV television signals through one or more filter circuits to a mixer. The mixer also receives a local oscillator signal which is heterodyned with the received radio frequency VHF and CATV television signals to develop an intermediate frequency signal for subsequent processing by the television receiver. Received radio frequency UHF television signals are typically converted to intermediate frequency signals in a separate section of the tuner and coupled through the VHF mixer, which is operated as an amplifier in response to the intermediate frequency UHF signals, for subsequent processing by the television receiver.

In order to tune the various television signal frequency bands, as well as the individual television channels within each band, each stage of the tuner comprises a tunable resonant circuit which is responsive to band-switching signals for facilitating tuning of each of the frequency bands and includes a variable reactance device, normally a varactor diode, responsive to a DC tuning voltage for tuning to different channels within a selected frequency band. One of these tunable resonant circuits is normally connected to an input of the VHF mixer stage which typically comprises a field effect transistor (FET) so used because of its relatively low noise figure and excellent cross modulation characteristics.

U.S. Pat. No. 4,048,598 teaches that FET's exhibit a rather large input parasitic capacitance which is on the same order of magnitude as the desired capacitance of varactor diodes used in the UHF range. In addition, this patent teaches that the impedance of a varactor tuned resonant circuit selected for use in the UHF band is relatively low at the low end of the UHF range while a FET is a relatively high impedance device. As a result of this impedance mismatch, the operation of the circuit is relatively poor at the low end of the UHF band although, since the impedance of the varactor tuned circuit increase with frequency, satisfactory operation is achieved at the high end of the UHF range. To overcome these problems, the foregoing patent discloses the use of impedance transformation means connected to the gate electrode of the FET; the impedance transformation means comprising a series capacitor and shunt inductor whose values are selected to provide a resonant point at a frequency below the lowest frequency in the UHF band. The impedance transformation means provides improved circuit performance at the low end of the UHF range while providing relatively little degradation at the high end of the range. For a similar purpose, the use of an impedance matching inductor in association with a VHF mixer stage is known for improving the performance of a tuner operating over the superband range of television signal frequencies.

In each of the foregoing prior art examples, a single inductor having a certain selected value of inductance is connected in shunt across the gate electrode of an FET to match the impedance of the FET to the impedance of a varactor tuned resonant circuit for the low end of a single band of television signal frequencies. Although this technique is adequate for improving the operating performance of a tuner when considering only a single band of television signal frequencies, its use cannot be extended to improve the performance of a multiband tuner where different impedance matching requirements must be satisfied for each different tunable band. In particular, while the selected value of inductance of the inductor may be appropriate for providing a good impedance match for one band, this value will generally not provide an acceptable impedance match in other bands.

Accordingly, it is a primary object of the present invention to provide a novel tuner circuit for a television receiver which is capable of improved performance over a plurality of television signal frequency bands.

It is a more specific object of the invention to provide a circuit adapted for matching the impedance of a varactor tuned resonant circuit to the input impedance of an active device such as a field effect transistor at the low end of each of a plurality of television signal frequency bands.

BRIEF DESCRIPTION OF THE DRAWINGS

FIG. 2 is a chart depicting the operation of the circuit of FIG. 1.

DESCRIPTION OF THE PREFERRED EMBODIMENT

Figure 1:
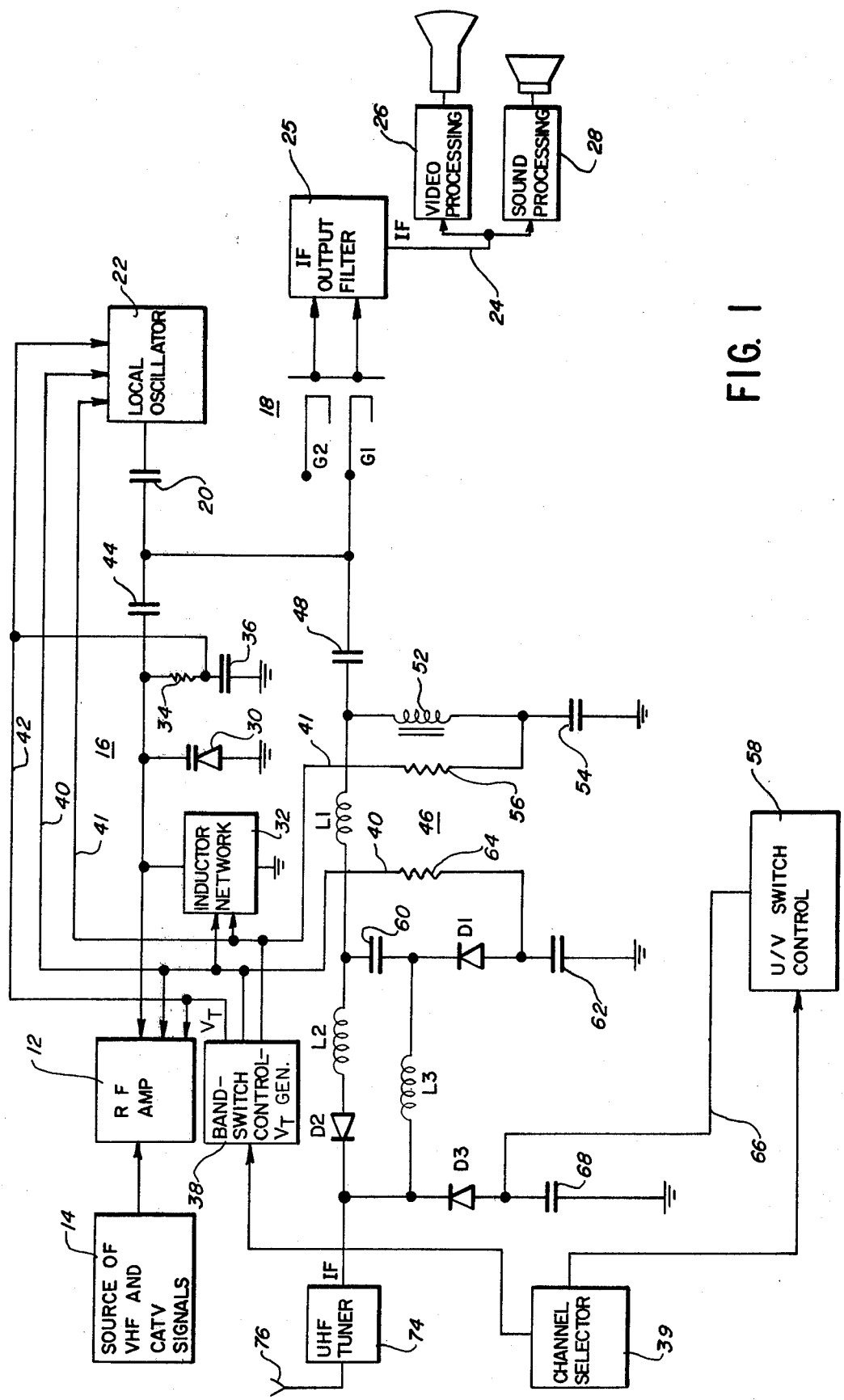
FIG. 1 illustrates, partially in block and partially in schematic diagram form, an impedance matching circuit according to the present invention.

In accordance with the transmission broadcast standards existing in the United States, the first five VHF television channels (channels 2-6) are transmitted within a low VHF band of frequencies which extends from 54 to 88 MHz. The remaining seven VHF channels (channels -13) are transmitted within a high VHF band of frequencies which extends from 120 to 216 MHz and specifically within the portion of this band extending between 174 to 216 MHz. The remaining portion of the high VHF band, 120 to 174 MHz, is commonly referred to as the mid-band frequency range and is used, together with a third band of frequencies known as the superband which extends from 216 to 300 MHz, to transmit CATV signals. In addition, television channels 14-83 are transmitted within a UHF band of frequencies extending between 470 and 890 MHz.

Referring to FIG. 1, there is shown partially in block diagram form and partially in schematic diagram form a television receiver tuning system constructed in accordance with the present invention and including a UHF tuning section for tuning television signals transmitted over the UHF band of frequencies and a signal conversion VHF tuning section for tuning television signals transmitted over the low VHF band, the mid/high VHF band and the superband of frequencies. It will be appreciated that the phrase "single conversion VHF tuning section" denotes the absence of a circuit dedicated to converting received CATV signals to a low VHF channel prior to processing by the VHF tuner. Therefore, in the circuit of FIG. 1, all received VHF and CATV signals are directly processed by the VHF tuning section without the necessity of including a CATV converter or the like.

The VHF tuning section of the receiver is of the superheterodyne type and includes an RF amplifier stage 12 which comprises a fixed tuned high pass filter, an input single tuned resonant circuit and an output double tuned resonant circuit including a varactor tuned circuit 16 for coupling received VHF and CATV signals from a signal source 14 to an input of a mixer which comprises, for example, the gate G1 of a dual-gate MOSFET 18. Gate G1 of FET 18 is also connected through a coupling capacitor 20 to the output of a local oscillator 22 whereby FET 18 is operative for beating or heterodyning the local oscillator signal with the output of resonant circuit 16 for developing an intermediate frequency (IF) signal on a conductor 24 connected to the output of an IF filter 25, the filtered IF signal being suitable for processing by the video and sound processing circuits 26 and 28 of the receiver. Varactor tuned resonant circuit 16 comprises, in addition to a varactor diode 30, a bandswitchable inductive network 32 and a series connected resistor 34 and capacitor 36, the inductance of network 32 being set to a different value for each frequency band tunable by the VHF tuning section and the capacitance of varactor diode 30 being adjusted for tuning a particular television channel with a selected frequency band. As a consequence, the equivalent impedance of resonant circuit 16 is different for each frequency band tunable by the VHF tuning section, each different impedance being relatively low at the low end of its respective frequency band. FET 18 is, however, a relatively high impedance device so that an undersirable impedance mismatch between FET 18 and resonant circuit 16 is formed, this impedance mismatch being different for each of the frequency bands and being especially noticeable at the low ends thereof where the signal power gain as well as the noise figure of the tuning circuit is severely degraded. In accordance with the present invention, the effects of the foregoing impedance mismatches are minimized by coupling a bandswitchable impedance transformation circuit between FET 18 and resonant circuit 16 for improving match therebetween for each frequency band over which the tuning circuit is operable and especially for the low ends of each of such bands.

Referring more specifically to the tuning system of FIG. 1, RF amplifier 12 and local oscillator 22 each includes a resonant circuit smaller in construction to resonant circuit 16. In particular, RF amplifier 12 normally includes an input resonant circuit and an output resonant circuit, the output resonant circuit forming together with resonant circuit 16 a double-tuned interstage coupling network. A bandswitch control and tuning voltage generator 38 is responsive to the channel selector 39 of the receiver for controlling the operation of the various resonant circuits by developing suitable bandswitching signals on a pair of output conductors 40 and 41 and by developing a direct current tuning voltage $V_T$ on an output conductor 42. The bandswitching signals developed on outputs 40 and 41 of control circuit 38 serve to select either the low VHF band, the mid/high VHF band or the CATV superband for tuning by appropriately conditioning the inductive network, e.g. network 32 of resonant circuit 16, of each resonant circuit, except the one associated with local oscillator 22, for exhibiting a value of total inductance to allow the varactor diodes 30 to tune the entire selected band. The tuning voltage $V_T$ developed on conductor 42 is set for adjusting the capacitance of each varactor diode 30 for causing each of the latter resonant circuits to resonate at the center frequency of a desired television channel. The resonant circuit associated with local oscillator 22 is similarly adjusted to resonate at a frequency appropriately higher than the selected channel center frequency by a fixed amount as established by the intermediate frequency of the tuning system. As previously described, the outputs of local oscillator 22 and resonant circuit 16 are then coupled to gate G1 of mixer FET 18 where they are heterodyned for producing the intermediate frequency signal on conductor 24.

The impedance transformation circuit of the invention comprises a capacitor 44 connected in series between gate G1 of FET 18 and the output of varactor tuned resonant circuit 16 and a bandswitchable inductive network 46 coupled through a capacitor 48 to gate G1 of FET 18, bandswitchable inductive network 46 being operable in response to the bandswitching signals developed on conductors 40 and 41 of bandswitch control generator 38 for connecting a different selected value of inductance in shunt with gate G1 of FET 18 for each frequency band over which the VHF tuning section is operable. More specifically, inductive network 46 comprises a biasing choke 52 connected through a by-pass capacitor 54 to ground potential, the junction formed between choke 52 and capacitor 54 being connected by a resistor 56 to output conductor 41 of bandswitch control generator 38. Choke 52 is also connected to an inductor L1 which is connected by a capacitor 60 to the cathode of a first bandswitching diode D1, the anode of diode D1 being connected through a by-pass capacitor 62 to ground potential and through resistor 64 to output conductor 40 of bandswitch control generator 38. Inductor L1 is also connected to the series combination of an inductor L2 and a second bandswitching diode D2, an inductor L3 being connected between the cathodes of switching diodes D1 and D2. The cathode of a final bandswitching diode D3 is connected to the cathode of diode D2 with the anode of diode D3 being connected through a by-pass capacitor 68 to ground potential and by a conductor 66 to a U/V switch control 58 which is responsive to channel selector 39. The UHF tuning section 74 of the television receiver, which is responsive to television signals received by an antenna 76, couples television signals converted to the intermediate frequency of the receiver to the junction formed between the cathodes of bandswitching diodes D2 and D3.

The table of FIG. 2 illustrates the operating characteristics of the bandswitchable inductive network 46 of FIG. 1. Assume initally that the VHF tuning section is being operated in response to channel selector 39 for tuning a channel within the superband range of frequencies. This will result in U/V switch control 58 being operated for producing a logically high signal on conductor 66 and bandswitch control generator 38 for producing bandswitching signals on conductors 40 and 41 both of which are logically high, forward biasing each of the bandswitching diodes D1, D2 and D3. Conductive diode D3 will shunt the output of UHF tuner 74 preventing the introduction of any UHF signals to gate G1 of FET 18 and conductive diode D1 will cause the total inductance $L_T$ of network 46 connected in shunt with gate G1 of FET 18 to assume a value corresponding to the inductance of inductor L1. The value of inductor L1 is selected such that, in association with the capacitance of capacitor 44, a resonant point is provided at a frequency below the lowest frequency in the superband range of frequencies which effectively raises the impedance associated with varactor tuned resonant circuit 16 at the low end of the superband range to a level approximately matching the input impedance of FET 18 at gate G1. As a consequence, the signal power gain as well as the noise figure of the tuner circuit is improved at the lower end of the band. Also, since the impedance matching circuit has little effect at the high end of the band, there is minimal degradation of circuit performance at these higher frequencies.

Assume next that the receiver is operated for tuning a channel in the low VHF band. In this case, U/V switch control 58 is operated for developing a logically high signal on conductor 66 and bandswitch control generator for developing logically low signals on both outputs 40 and 41. These bandswitching signals will render diode D3 conductive and diodes D1 and D2 non-conductive. Therefore, the output of UHF tuner 74 will again be shunted to ground potential while the total inductance $L_T$ of network 46 connected in shunt with gate G1 of FET 18 will assume a value corresponding to the sum of the inductances of inductors L1 and L3. The value of inductor L3 is now selected such that the capacitance of capacitor 44 in association with the combined inductances of inductors L1 and L3 provide a resonant point at a frequency below the lowest frequency in the low VHF band. Consequently, the impedance associated with varactor tuned resonant circuit 16 at the low end of the low VHF band is raised to a level approximately matching the input impedance of FET 18 at gate G1 thereby improving the signal power gain and the noise figure for the tuner over this range of frequencies. It will be appreciated that the impedance matching requirements in the low VHF band are different from the impedance matching requirements in the superband range of frequencies due to the different equivalent impedances of resonant circuit 16 for the two bands, which different impedances result from the different inductances characterizing inductive network 32 in each case. In accordance with the invention, satisfaction of these two different impedance matching requirements is facilitated by bandswitching inductive network 46 as described above whereby the effective impedance of resonant circuit 16 may be independently controlled for each band by selecting appropriate values for inductors L1 and L3.

The high/mid VHF band provides yet another different impedance matching requirement due to the different value of inductance exhibited by network 32. To accommodate such, U/V switch control 58 is operated in this band for developing a logically high signal on conductor 66 and bandswitch control generator 38 for developing a logically low signal on conductor 40. As a consequence, in this band, bandswitching diodes D2 and D3 are rendered conductive while diode D1 is reverse biased. The output of UHF tuner 74 is again shunted to ground potential and the total inductance $L_T$ of network 46 connected to shunt with gate G1 of FET 18 takes on a value corresponding to the sum of inductances of inductor L1 and the parallel combination of inductors L2 and L3. The value of inductor L2 is selected such that the combined inductance $L_T$, in association with the capacitance of capacitor 44, provides a resonant point at a frequency below the lowest frequency in the band. Therefore, as in the previous cases, the impedance associated with varactor tuned circuit 16 at the low end of the high/mid VHF band is raised to a level approximately matching the input impedance at gate G1 of FET 18 thereby improving the signal power gain and noise figure for the tuner over this range of frequencies.

When channel selector 39 is operated for tuning a channel in the UHF band, U/V switch control 58 is operated for developing a logically low signal on conductor 66 and bandswitch control generator 38 for developing a logically high signal on conductor 41 and logically low signal on conductor 40. Therefore, bandswitching diode D2 is forward biased while diodes D1 and D3 are reverse biased into non-conducting states. The intermediate frequency output signal of UHF tuner 74 is no longer shunted to ground potential but rather is coupled through conductive diode D2, inductors L1 and L2 and coupling capacitor 48 to gate G1 of FET 18. In a manner well known in the television art, FET 18 operates as an intermediate frequency amplifier in response to the intermediate frequency UHF signals due to the disabling of VHF local oscillator 22 for the UHF band. The amplified UHF intermediate frequency signals are then coupled from the output of FET 18 to the video and sound processing circuits 26 and 28 of the receiver for reproducing the televised video and audio information.

What has thus been shown is an improved television receiver tuning system including a bandswitchable impedance transformation circuit operable for improving the impedance match between a varactor tuned resonant circuit and the gate electrode of an FET at the low ends of the low VHF band, the high/mid VHF band and the CATV superband. As a result, the signal power gain and the noise figure of the tuner is improved at the low ends of these bands without degrading tuner performance at the high ends of the bands. In addition, the complexity of the system is minimized by using a common bandswitch control 38 for controlling both the impedance tranformation circuit and the varactor tuned circuits associated with the tuning system.

While a particular embodiment of the present invention has been shown and described, it is apparent that changes and modifications may be made therein without departing from the invention in its broader aspects. For example, while the preferred embodiment of the invention refers specifically to a mixer stage comprising a FET, the invention is equally applicable to other mixing devices such as bipolar transistors. Also, if necessary, the system can easily be modified to accommodate additional television signal frequency bands. The aim of the appended claims, therefore, is to cover all such changes and modifications as fall within the true spirit and scope of the invention.

What is claimed is:

1. In a television receiver tuner operable for tuning a plurality of television signal bands, the improved apparatus comprising:

bandswitch means having a plurality of output conductors for developing a different set of bandswitch control signals defining each of said television signal bands;

a tuned circuit including a first band-switchable inductive network and a varactor diode, said first band-switchable inductive network being responsive to said bandswitch control signals for assuming a different effective inductance for tuning each of said television signal bands;

a mixer transistor having an input electrode;

capacitance means coupled in series between said input electrode and said tuned circuit; and a second band-switchable inductive network coupled to said input electrode and responsive to said band-switch control signals for connecting a different value of effective inductance in shunt with said input electrode for each of said television signal bands, each of said different values of inductance of said second inductive network providing, in association with said capacitance means, a resonant frequency below the lowest channel frequency of the corresponding one of said plurality of television signal bands for matching the impedance coupled to said input electrode with the impedance of said mixer transistor at said input electrode at the low end of the respective television signal band.

2. The apparatus according to claim 1 wherein said mixer transistor comprises a field effect transistor and wherein said input electrode comprises a gate electrode of said field effect transistor.

3. The apparatus according to claim 1 wherein said television receiver tuner is operable for tuning at least three different television signal bands and wherein said second inductive network comprises three inductors.

4. The apparatus according to claim 3 wherein said at least three different television signal bands comprise the low VHF band, the high VHF/Mid band and the Superband.

* * * * *